US 6,560,106 B2

(12) United States Patent
Ivey et al.

(10) Patent No.: US 6,560,106 B2
(45) Date of Patent: May 6, 2003

(54) CONTROL PANEL ASSEMBLY

(75) Inventors: Sam Ivey, Richardson, TX (US);
Martha G. Peterson, McKinney, TX (US); JoMichael Porter, Dallas, TX (US); Farrukh Syed, McKinney, TX (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/944,535

(22) Filed: Aug. 31, 2001

(65) Prior Publication Data
US 2003/0043545 A1 Mar. 6, 2003

(51) Int. Cl.⁷ .................................................. H05V 7/20
(52) U.S. Cl. ....................... 361/695; 361/690; 361/694; 361/725; 174/16.1; 165/80.2; 165/104.33; 454/184
(58) Field of Search ................................ 361/600, 601, 361/627, 633, 641, 676–679, 683–690, 694, 695, 721, 724–727; 144/16.1, 50, 66, 67; 312/223.1, 223.2

(56) References Cited

U.S. PATENT DOCUMENTS

| | | | | | |
|---|---|---|---|---|---|
| 5,362,933 A | * | 11/1994 | Kutsche et al. | ................ | 16/376 |
| 5,398,161 A | * | 3/1995 | Roy | ............................ | 361/685 |
| 5,924,782 A | * | 7/1999 | Park | ............................ | 16/342 |
| 6,144,549 A | * | 11/2000 | Moss et al. | ............... | 312/223.1 |
| 6,317,329 B1 | * | 11/2001 | Dowdy et al. | ........... | 312/223.3 |
| 6,392,140 B1 | * | 5/2002 | Yee et al. | ...................... | 174/50 |

* cited by examiner

*Primary Examiner*—Boris Chervinsky

(57) ABSTRACT

A control panel assembly includes a modular control panel box that is mounted to a door. The door is used to cover an opening that affords access to an internal component bay that resides within an electrical system housing. A tongue and groove joint provides a mechanism for selective positioning of the modular control panel box on the door such that the modular control panel box may be moved to a position that does not interfere with opening motion of the door that, otherwise, would occur when the modular control panel box moves rearwardly of the opening to contact an adjacent chassis.

19 Claims, 5 Drawing Sheets

CONTROL PANEL ASSEMBLY

BACKGROUND OF THE INVENTION

1. Field of the Invention

The present invention pertains to the field of control panel assemblies that provide manual and visible access to displays and switches that are used to control the operation of electronic systems. More particularly, the control panel assemblies are mounted on doors that facilitate access to internal system components.

2. Description of the Related Art

Electrical equipment racks are commonly used to stack a plurality of system chassis in vertical ascending order within close proximity to one another. Rack space is always at a premium, and various schema have been created to increase the density of equipment storage. For example, some chassis may be mounted upon telescoping rail assemblies to facilitate forward and rearward motion of the chassis in respect to the rack for purposes of performing maintenance and renewal operations on system components that are attached to the chassis.

Other facilities employ a door on the front of the chassis that swings open to facilitate access to the internal electrical components. If the door is mounted on a hinge that swings from the side, the elongated structure of the door typically requires additional aisle space that decreases the otherwise obtainable density of components on adjacent equipment racks. Accordingly, it is desirable to use a hinged door that swings open from the bottom or the top to minimize the aisle space requirements.

Problems arise in the use of doors that swing open from the bottom or the top because it is common practice to provide a cosmetic bezel that attaches to the door. Where controls, such as optical displays or switches, are required for system operation, there are sometimes pass-through mechanisms that, for example, provide continuity for an optical pathway or buttons that pass through the bezel to depress hidden switches in the door. When the bezel is removed from the door, these optical pathways and switches require additional labeling and operator instructions, but it is sometimes impracticable to place the labeling and operator instructions on the door. Thus, many of these control panel assemblies utilize a control panel that protrudes through an opening in the bezel.

Design requirements for densified arrays of electrical systems in equipment racks often call for reducing the height of individual system components. Thus, the systems are increasingly designed with a profile that is short and wide. A problem arises in circumstances where it is desired to have the control panel pass through the bezel in the context of newer devices having a short and wide profile because the control panel, upon downward or upward rotation of the door, travels downwardly a sufficient distance to abut the next chassis in sequence. Thus, the door is not fully able to open.

There is an existing need for a forward-protruding control panel assembly that overcomes the problem of rotational interference by abutment against an adjacent chassis.

SUMMARY OF THE INVENTION

The present invention overcomes the problems that are outlined above and advances the art by providing a control panel assembly comprising a modular control panel box that attaches to a hinged door and is selectively positionable to permit opening and closing of the door without interference from an adjacent chassis.

The control panel assembly comprises an electrical housing that defines an interior component bay and an opening for access to the interior component bay. The interior component bay may, for example, contain a plurality of electrical components, such as fans, power supplies, peripheral cards, cell boards, controllers, communications interface cards, or any other system device that may be accessed through the opening for system maintenance. A door is hingedly mounted to the electrical housing for selective positioning where the door either covers the opening to seal the interior component bay or the door is opened to uncover the opening. The door has a rearward side proximate the interior component bay and a forward side remote from the rearward side. A modular control panel box is coupled with the door through use of selectively positionable mounting structure on the forward side of the door, which affords selective movement of the modular control panel box to positions on the door such that forward movement of the door away from the interior component bay fully uncovers the opening before the modular component box swings rearward of the opening to abut an adjacent chassis. The mounting structure may be is operably configured for selective removal and reattachment of the modular control panel box on the door.

The door may be provided in a configuration, for example, where when moved to cover the housing opening, the door rises from a bottom to a top, and the door is hingedly mounted to the electrical housing at the bottom of the door. The door may comprise an electromagnetic interference (EMI) enclosure that fits tightly against the opening and is drawn tightly thereto, for example, by the use of a twist-draw latch proximate the top of the door to facilitate tight closure of the door against the opening and assure electromagnetic interference compatibility.

The modular control panel box may be provided with a variety of system control features, for example, comprising a panel air vent and a sensor configured to sense temperature of incoming ambient air entering the air vent. The sensor provides signals based upon the sensed temperature from the sensor. The door may then comprise a door air vent in communication with the panel air vent for passage of air from within the modular control panel box through the door air vent and into the interior component bay. The interior component bay contains a fan for drawing air into the interior component bay. The modular control panel box may also comprise a display for providing electronically configurable indicia representing a system operating parameter, such as voltage or temperature.

A demountable front bezel may be provided for covering the front face of the door. The bezel may have an opening for receipt of the modular control panel box. The demountable front bezel permits visible access to the display when the demountable front bezel is installed over the modular control panel box.

The modular control panel box may also comprise a power switch that configured for selective power activation of electronic components within the interior component bay. The power switch is optionally located in a position that is available for manual access when the demountable front bezel is installed over the modular control panel box.

The selectively positionable mounting structure of the control panel assembly may comprise the door and the modular control panel box, in combination, having a channel-track assembly for use in moving the modular control panel box between a high position and a low position on the front side of the door. The channel track assembly further permits selective removal and reattachment of the modular control panel box by moving the modular control panel box a sufficient distance to disengage the modular control panel box from the channel track assembly. The channel track assembly may, for example, comprise a tongue and groove joint. A clip latch assembly for use in detachably locking the modular control panel box in at least one of the high position and the low position.

A ribbon cable may connect the modular control panel box with the door for use in transmitting control signals from electronic circuitry that resides in the modular control panel box. Another cable may similarly connect the modular control panel box or associated components with the electrical housing to drain electrostatic discharges (ESD).

The control panel assembly may be used according to a method comprising the steps of:

(a) shifting the modular control panel box along the channel-track assembly to a position that does not interfere with opening of the door; and (b) opening the door to facilitate access to the interior component bay. The method of use may also comprise steps of:

(c) removing the modular control panel box from the channel-track assembly to demount the modular control panel box from the door; and (d) accessing the interior component bay to install a card within the internal component bay.

DETAILED DESCRIPTION

There will now be shown a control panel assembly including a door-mounted modular control panel box that may be shifted on a channel track assembly to a selected position that does not interfere with opening and closing action of the door. The door may be opened to facilitate access to an interior component bay within an electrical system housing. The following description represents a preferred embodiment that is used to show and describe the concepts and instrumentalities of the control panel assembly. As such, the disclosed embodiments should not be used to unduly limit the scope of the disclosed concepts, because the teaching is by way of example and not by limitation.

Figure 1:
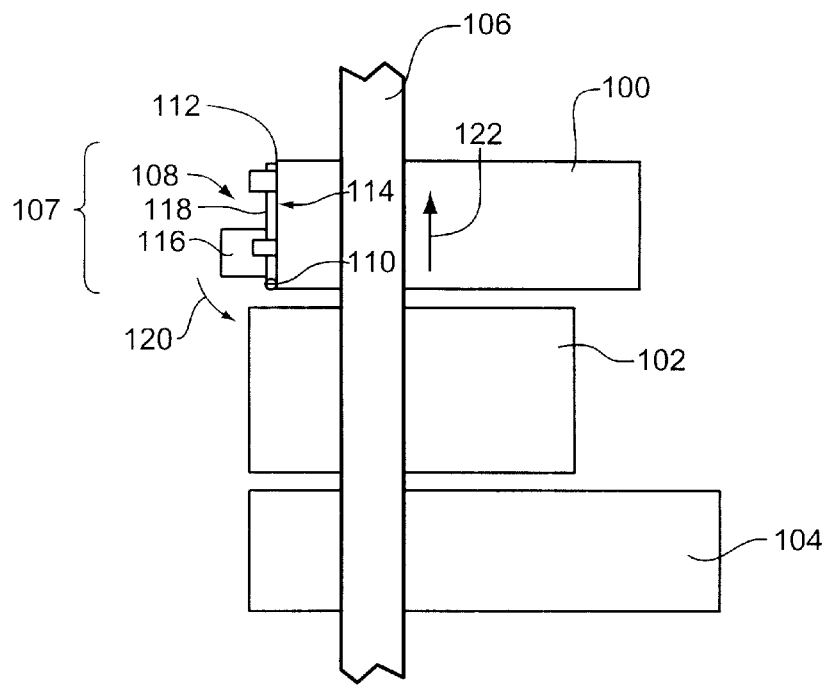
FIG. 1 is a side elevational view of an electrical housing that includes a selectively positionable control panel assembly containing a forward-protruding modular control panel box that may be positionally adjusted to prevent abutment between the modular control panel box and an adjacent chassis.

FIG. 1 depicts a side view of an electrical chassis or housing 100 that resides in vertically stacked relationship to the additional chassis 102, 104, on an equipment rack 106. The electrical housing 100 is provided with a control panel assembly 107 including a door 108 that is mounted to electrical housing 100 through use of a hinge 110 to cover an opening 112 leading to the interior of electrical housing 100 proximate a rearward side 114 of the door 108. A modular control panel box 116 resides in a selective positioning structure, such as channel track assembly 118, on the front side of the door 108.

Figure 2:
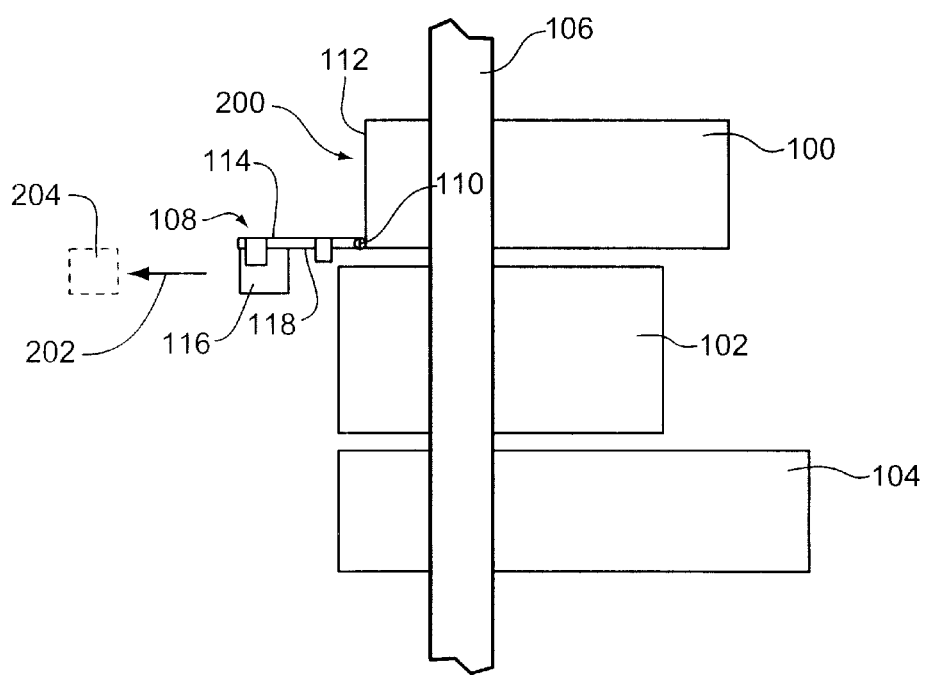
FIG. 2 is a side elevational perspective view showing selective positional adjustment of the modular control panel box.

As shown in FIG. 1, opening of the door 108 in a downward pivoting motion along arc 120 would cause the modular control panel box 116 to abut chassis 102 with resultant interference with the pivoting motion of door 108 along arc 120. Thus, door 108 would not fully open. Nevertheless, the modular control panel box may be selectively shifted along the channel-track assembly 118 in the direction of arrow 122 to a high position, as shown in FIG. 2, that does not suffer interference from chassis 102. As shown in FIG. 2, the modular control panel box 116 has been shifted to the high position along channel-track 118, and door 108 has been opened (FIG. 1 shows door 108 in the closed position against opening 112). Thus, as shown in FIG. 2, door 108 occupies an open position remote from opening 112, which facilitates access to an interior component bay 200 through opening 112. The modular control panel box 116 may be further shifted in the direction of arrow 202 towards phantom position 204 for complete detachment of the modular control panel box 116 from the channel track assembly 118.

Figure 3:
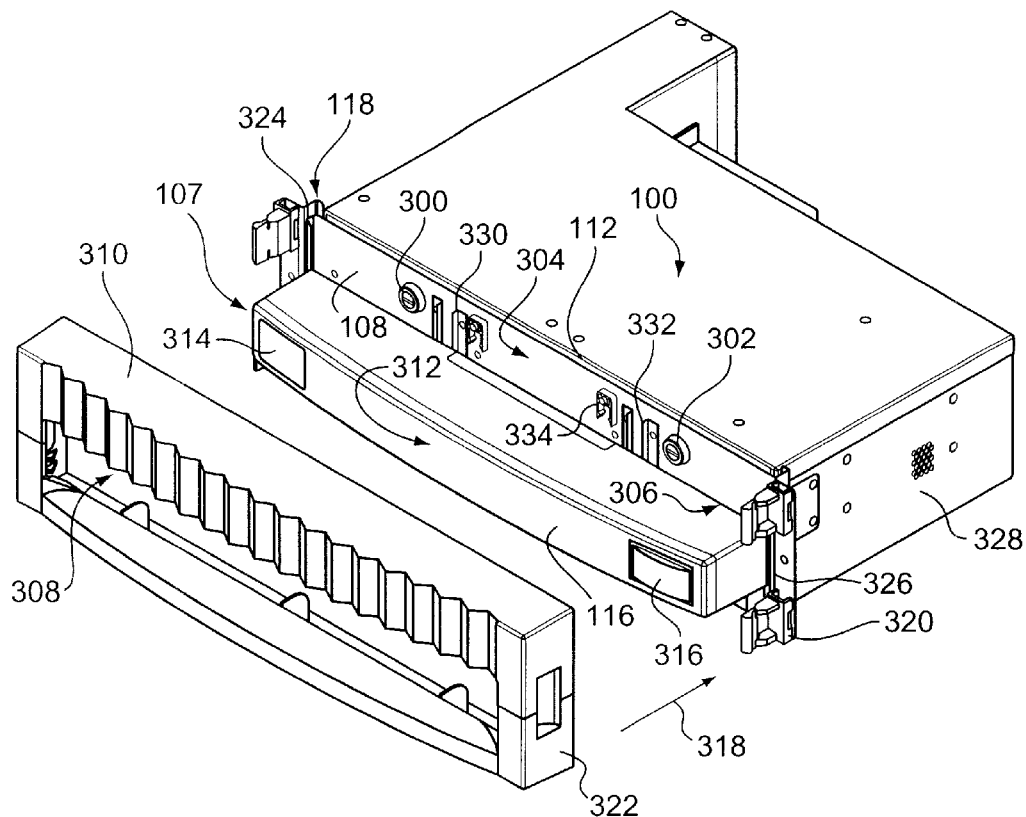
FIG. 3 is a top, right, front perspective view of the control panel assembly mounted on the electrical housing.

FIG. 3 provides additional detail regarding a specific implementation of the control panel assembly 107. Door 108 is provided with twist-draw latch mechanisms 300, 302, which pull door 108 close to opening 112 for purposes of providing an EMI enclosure and assuring that the electrical chassis meets electromagnetic compliance guidelines. The modular control panel box 116 protrudes outwardly from a front face 304 of door 108 and occupies a low position at interface 306 that is designed to meet with and protrude through aperture 308 in a cosmetic bezel 310. The aperture 308 provides visible access to face 312 of the modular control panel box 116, as well as visible access to an electronically configurable display 314 and manual access to a power switch 316. The display 314 is used to display a system parameters, such as cabinet identification and internal system voltage status within electrical housing 100. The power switch 316 may be manually depressed to power-on and power down the system.

As shown in FIG. 3, the bezel 310 is not attached. Full attachment of the bezel 310 occurs when the bezel 310 is moved towards the door 108 in the direction of arrow 318 for mating engagement of the modular control panel box 116 within aperture 308 until respective clip latch assemblies 320 engage the interior sidewall surfaces of bezel 310, such as those for sidewall 322.

The detachable mounting structure includes a channel track assembly 118, which is, in part, formed from an opposed pair of grooves 324 and 326 that face inwardly toward one another and are mounted directly to door 108. In contrast, the clip latch assemblies 320 are attached, for example, to the sidewall 328 of electrical housing 100.

Figure 4:
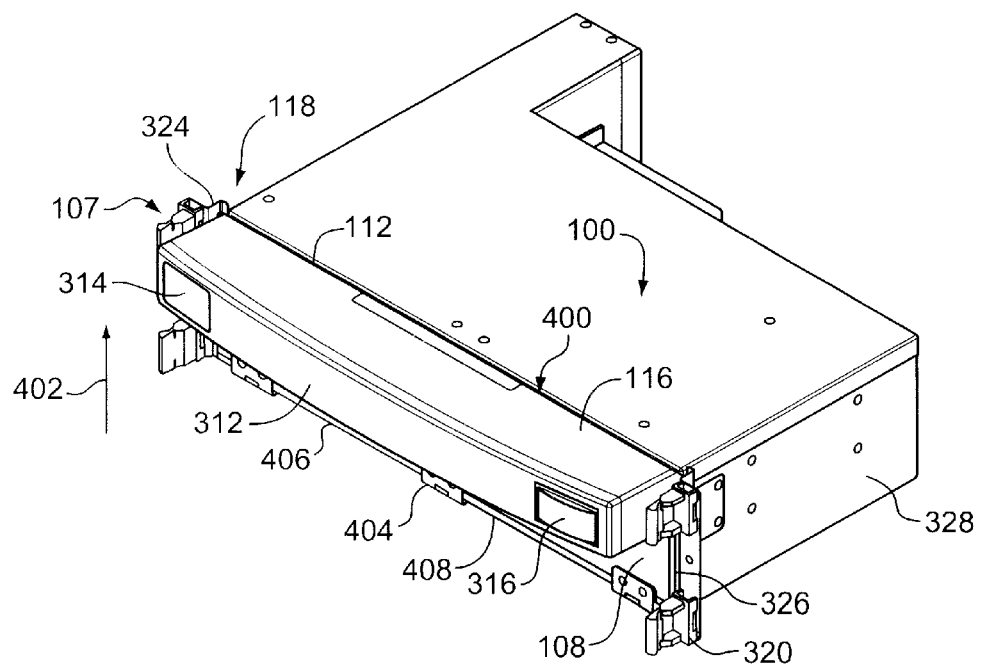
FIG. 4 illustrates selective positional adjustment of the modular control panel box on the control panel assembly.
Figure 8:
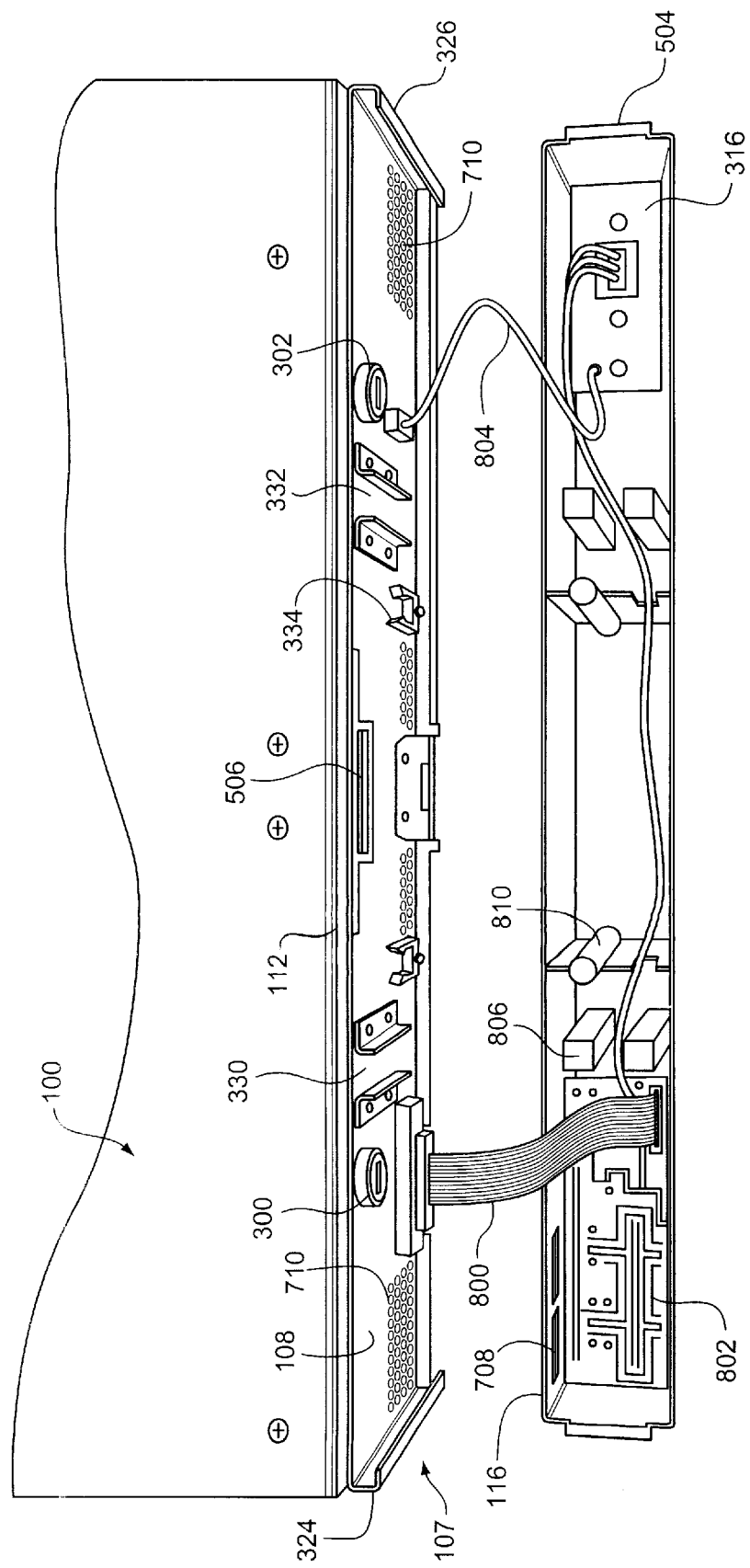
FIG. 8 is a top, front perspective view showing complete detachment of the modular control panel box from the control panel assembly.

Vertically oriented guide rails 330, 332 interface with internal structure (not shown) within the modular control panel assembly 116 and impart lateral stability when the modular control panel box 116 slides within channels 324, 326 between the low position at interface 306 and an upper position at interface 400, which is shown in FIG. 4. A plurality of snap-locks 334 are capable of selectively retaining the modular control panel box at high and low positions on door 108. These snap-locks 334 interface with internal components of the modular control panel box, as shown in FIG. 8. Removal of the upper snap-locks 334 permits detachment of the modular control panel box 116 from door 108.

FIG. 4 demonstrates that the modular control panel box 116 may be manually positioned in the upward direction of arrow 402 to arrive at the upper position of interface 400. The modular control panel box 116 slides upwardly within grooves 324, 326 and may be pulled completely free from the grooves 324, 326 with additional upward motion of the modular control panel box 116 in the direction of arrow 402. Hinges 404 are shown coupling the bottom edge 406 of door 108 with electrical housing 100 proximate the bottom edge 408 of opening 112.

Figure 5:
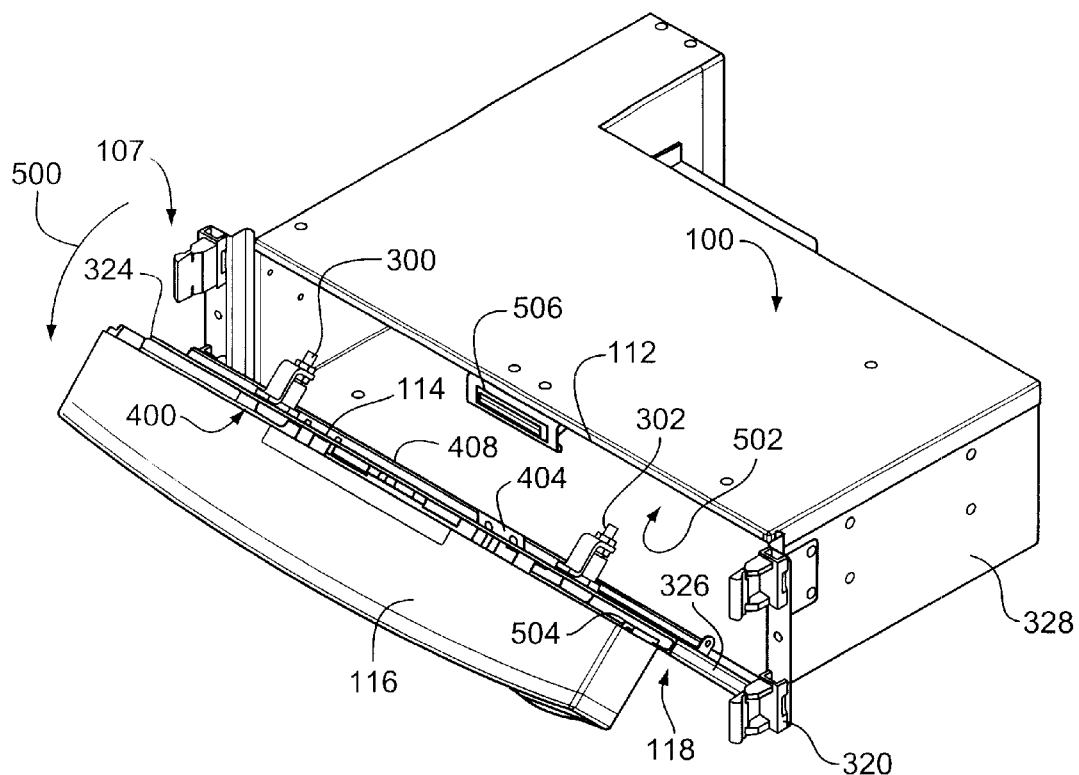
FIG. 5 shows opening of a door forming part of the control panel assembly after selective positional adjustment of the modular control panel box.

FIG. 5 shows that the door 108 may be opened while the modular control panel box 116 occupies the upper position at interface 400 on door 108, provided the twist-draw latches 300 and 302 have previously been opened. Downward pivoting of door 108 in the direction of arc 500 removes the rearward side 114 of door 108 from the closed position against opening 112 to reveal an interior component bay 502 that resides within electrical housing 100. With door 108 fully opened, access to the interior component bay 502 through opening 112 affords access to interior electronic components (not shown), such as peripheral cards or cell boards, which may be removed and replaced. A tongue 504 interfaces with groove 326 to form a tongue and groove type of channel track assembly 118. A magnetic catch 506 is used to hold door 108 closed after the twist-draw latch mechanisms 300, 302 have been disengaged. Thus, twist-draw latch mechanisms 300, 302 can be disengaged, the modular control panel box 116 raised to interface 400, and door 108 may be pulled open to disengage the magnetic catch 506. Closure of door 108 occurs in reverse order.

Figure 6:
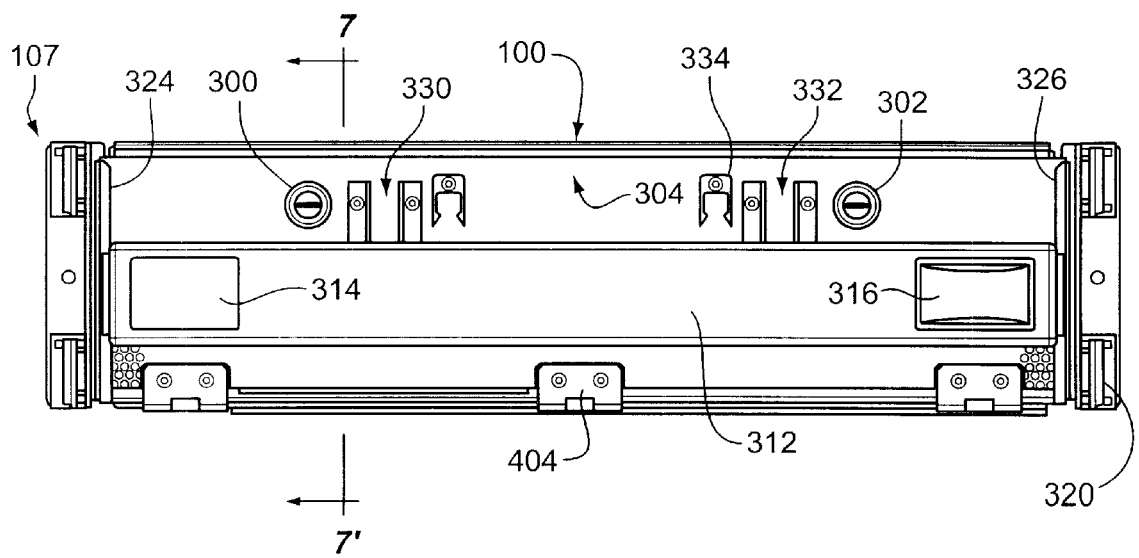
FIG. 6 is a front elevational view showing section line 7-7'.
Figure 7:
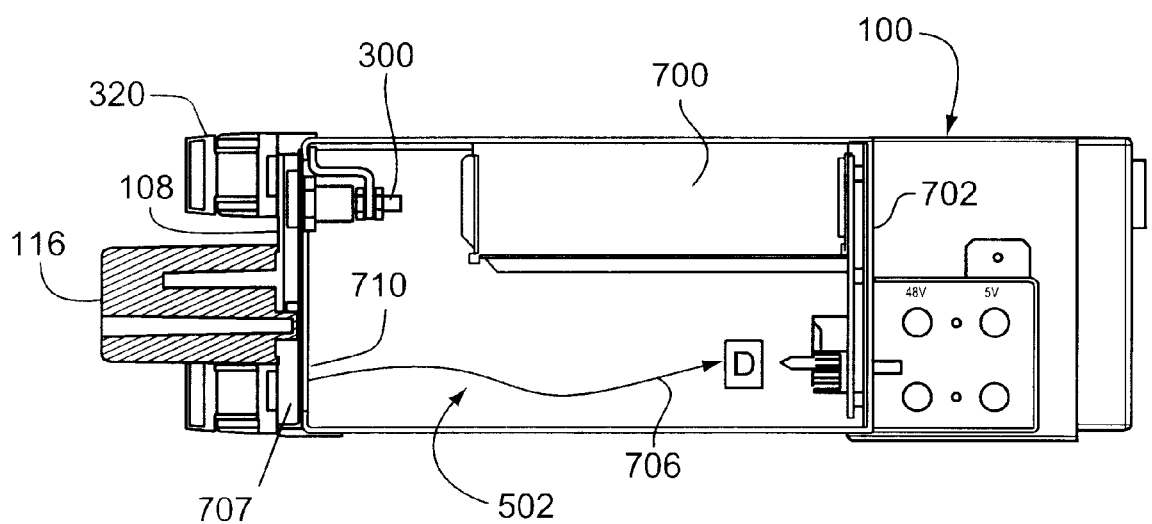
FIG. 7 is a misdsectional view taken along line 7-7' of FIG. 6.

FIG. 6 is a front elevational view of the control panel assembly 107 including a section line 7–7' that forms the basis for FIG. 7, which is a midsectional view taken along line 7–7'. Interior components of the interior component bay 502 may include, for example, a removable access panel 700 and an electrical backplane 702 for receipt of printed circuit boards and the like (not shown). An air pathway 706 passes through the modular control panel box (past, for example, an air temperature sensor 707), through a perforated wall 710 and into interior component bay 502 for discharge through an appropriate discharge opening D.

FIG. 8 is a top perspective view showing the rear of modular control panel box 116 detached from grooves 324, 326. A ribbon cable 800 connects door 108 with a control panel circuit board 802. The control panel circuit board 802 contains circuitry that assists in the operation of systems within the electrical housing 100. For example, the control panel circuit board 802 may contain a sensor that determines the temperature of ambient air entering through intake air vent 708. The control panel circuit board 802 may transmit control signals based upon the sensed temperature. Similarly, an ESD cable 804 may drain ESD from door 108 or electrical components that are mounted on door 108. Fingers 806 are used to slidingly engage guide rail 330 to secure the modular control panel box 116 when installed in the grooves 324, 326. A clip latch structure 808 resiliently contacts cylinder 810 to selectively and detachably lock the modular control panel box 116 at the respective interfaces 306, 400 that are shown in FIGS. 3 and 4, depending upon the high or low position of the modular control panel box 116 on door 108.

Those skilled in the art will appreciate that the foregoing discussion presents the preferred embodiments only, and that elements of the discussion may be subjected to ordinary modifications by those skilled in the art without departing from the scope and spirit of what is being taught. Accordingly, the inventors hereby state their intention to rely upon the Doctrine of Equivalents to protect their full rights in the invention.

We claim:

1. A control panel assembly comprising:
   an electrical housing that defines
   an interior component bay, and
   an opening for access to the interior component bay;
   a door hingedly mounted to the electrical housing for selective positioning to cover and uncover the opening, the door having a rearward side proximate the interior component bay and a forward side remote from the rearward side;
   a modular control panel box; and
   track mounting structure coupling the modular control panel box with the door on the forward side of the door and permitting movement of the modular control panel box between a first position and a second position such that forward movement of the door uncovering the opening has a greater range of arcuate motion when the modular control panel box is in the second position, as compared to the range of arcuate motion when the modular control panel box is in the first position.

2. The control panel assembly as set forth in claim 1, wherein the track mounting structure is operably configured for selective removal and reattachment of the modular control panel box onto the door.

3. The control panel assembly as set forth in claim 1, wherein the door has a bottom segment connected to the electrical housing by a hinge that permits selective pivoting motion of the door to cover and uncover the opening.

4. The control panel assembly as set forth in claim 3, wherein the door comprises an EMI enclosure.

5. The control panel assembly as set forth in claim 4 comprising a draw latch proximate the top of the door to facilitate tight closure of the door against the opening and assure electromagnetic interference compatibility.

6. The control panel assembly as set forth in claim 1, wherein the modular control panel box comprises
   a panel air vent, and
   a sensor configured to sense temperature of incoming ambient air entering the air vent and provide control signals based upon the sensed temperature;
   the door comprises a door air vent in communication with the panel air vent for passage of air from within the modular control panel box through the door air vent and into the interior component bay; and
   the interior component bay contains a pathway for drawing air into the interior component bay through the panel air vent and the door air vent.

7. The control panel assembly as set forth in claim 1, wherein the modular control panel box comprises a display for providing electronically configurable indicia representing a system parameter.

8. The control panel assembly as set forth in claim 7, comprising a demountable front bezel having an opening for receipt of the modular control panel box, the demountable front bezel permitting visible access to the display when the demountable front bezel is installed over the modular control panel box.

9. The control panel assembly as set forth in claim 8, wherein the modular control panel box comprises a power switch configured for selective power activation of electronic components within the interior component bay, the power switch being located in a position available for manual access when the demountable front bezel is installed over the modular control panel box.

10. The control panel assembly as set forth in claim 1, wherein the track mounting structure is operable to shift the modular control panel box between a high position and a low position.

11. The control panel assembly as set forth in claim 10, wherein the track mounting structure affords selective removal and reattachment of the modular control panel box by moving the modular control panel box a sufficient distance to disengage the modular control panel box from the track mounting structure.

12. The control panel assembly as set forth in claim 10 wherein the channel track assembly comprises a tongue and groove joint.

13. The control panel assembly as set forth in claim 12, comprising a clip latch assembly for use in detachably locking the modular control panel box in at least one of the high position and the low position.

14. The control panel assembly as set forth in claim 10, comprising a ribbon cable connecting the modular control panel box with the door.

15. The control panel assembly as set forth in claim 14, comprising an ESD cable connecting the modular control panel box with the electrical housing.

16. A method of opening a door that is hingedly mounted to an electrical housing proximate an opening to an interior component bay, where the door has a forward side that contains a channel-track assembly mounting a modular control panel box to the door, the method comprising the steps of:

shifting the modular control panel box along the channel-track assembly from a first position that interferes with opening of the door to a second position that does not interfere with opening of the door; and opening the door to facilitate access to the interior component bay.

17. The method according to claim 16, further comprising a step of removing the modular control panel box from the channel-track assembly to demount the modular control panel box from the door.

18. The method according to claim 16, comprising a step of accessing the interior component bay to install a card within the internal component bay.

19. A control panel assembly comprising:

an electrical housing that defines an interior component bay, and an opening for access to the interior component bay;

a door having a rearward side proximate the interior component bay, a forward side remote from the rearward side, a bottom edge and a top edge, the door having a perforated wall proximate the bottom edge of the door, the door having a draw-latch assembly proximate the top edge of the door for use in drawing the door tightly against the opening to form an EMI enclosure between the door and the opening;

a hinge proximate the bottom edge of the door for selective positioning of the door to cover and uncover the opening;

a modular control panel box; and a channel track mounting structure coupling the modular control panel box with the door on the forward side of the door and providing selective positioning of the modular control panel box such that the modular control panel box may be positioned at a location selected from the group consisting of a first position covering the draw latch assembly, a second position covering the perforated wall of the door, and a third position detached from the channel track mounting structure.

* * * * *